(12) United States Patent
Ahn et al.

(10) Patent No.: US 8,895,442 B2
(45) Date of Patent: *Nov. 25, 2014

(54) COBALT TITANIUM OXIDE DIELECTRIC FILMS

(71) Applicant: Micron Technology, Inc., Boise, ID (US)

(72) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/908,479

(22) Filed: Jun. 3, 2013

(65) Prior Publication Data

US 2013/0264625 A1    Oct. 10, 2013

Related U.S. Application Data

(60) Continuation of application No. 13/311,218, filed on Dec. 5, 2011, now Pat. No. 8,455,959, which is a division of application No. 11/216,958, filed on Aug. 31, 2005, now Pat. No. 8,071,476.

(51) Int. Cl.

| | |
|---|---|
| H01L 23/02 | (2006.01) |
| H01L 21/28 | (2006.01) |
| C23C 16/455 | (2006.01) |
| H01L 49/02 | (2006.01) |
| H01L 29/06 | (2006.01) |
| H01L 21/316 | (2006.01) |
| H01L 29/51 | (2006.01) |
| H01L 29/94 | (2006.01) |
| H01L 29/788 | (2006.01) |
| H01L 29/78 | (2006.01) |
| H01L 21/314 | (2006.01) |
| C23C 16/40 | (2006.01) |

(52) U.S. Cl.
CPC .......... *H01L 29/06* (2013.01); *H01L 21/28273* (2013.01); *C23C 16/45531* (2013.01); *H01L 28/40* (2013.01); *H01L 21/31604* (2013.01); *H01L 29/513* (2013.01); *H01L 29/517* (2013.01); *C23C 16/45553* (2013.01); *H01L 29/94* (2013.01); *H01L 21/28194* (2013.01); *H01L 29/788* (2013.01); *C23C 16/45525* (2013.01); *H01L 29/78* (2013.01); *H01L 29/7881* (2013.01); *H01L 21/3141* (2013.01); *C23C 16/40* (2013.01)

USPC .......... 438/680; 438/240; 438/260; 438/197; 257/E21.013; 257/E21.17

(58) Field of Classification Search
USPC .......... 438/680, 240, 260, 197; 257/E21.013, 257/E21.17
See application file for complete search history.

(56) References Cited

U.S. PATENT DOCUMENTS

| | | |
|---|---|---|
| 4,645,622 A | 2/1987 | Kock |
| 5,593,912 A | 1/1997 | Rajeevakumar |

(Continued)

OTHER PUBLICATIONS

Aarik, J., et al., "Atomic layer growth of epitaxial TiO/sub 2/ thin films from TiCl/sub 4/ and H/sub 2/O on alpha -Al/sub 2/O/sub 3/ substrates", Journal of Crystal Growth, 242(1-2), (2002), 189-198.

(Continued)

*Primary Examiner* — Julia Slutsker
(74) *Attorney, Agent, or Firm* — Schwegman Lundberg & Woessner, P.A.

(57) ABSTRACT

Electronic apparatus and methods of forming the electronic apparatus include cobalt titanium oxide on a substrate for use in a variety of electronic systems. The cobalt titanium oxide may be structured as one or more monolayers. The cobalt titanium oxide may be formed by a monolayer by monolayer sequencing process such as atomic layer deposition.

25 Claims, 3 Drawing Sheets

FORM A HEMISPHERICAL GRAINED POLYSILICON REGION ON A SUBSTRATE FOR AN ELECTRONIC DEVICE — 110

FORM A COBALT TITANIUM OXIDE FILM ON THE HEMISPHERICAL GRAINED POLYSILICON REGION INCLUDING FORMING A COBALT TITANIUM OXIDE FILM BY ATOMIC LAYER DEPOSITION — 120

(56) References Cited

U.S. PATENT DOCUMENTS

| | | |
|---|---|---|
| 5,981,350 A | 11/1999 | Geusic et al. |
| 6,025,225 A | 2/2000 | Forbes et al. |
| 6,025,627 A | 2/2000 | Forbes et al. |
| 6,090,636 A | 7/2000 | Geusic et al. |
| 6,134,175 A | 10/2000 | Forbes et al. |
| 6,150,188 A | 11/2000 | Geusic et al. |
| 6,191,448 B1 | 2/2001 | Forbes et al. |
| 6,198,168 B1 | 3/2001 | Geusic et al. |
| 6,294,813 B1 | 9/2001 | Forbes et al. |
| 6,317,357 B1 | 11/2001 | Forbes |
| 6,331,465 B1 | 12/2001 | Forbes et al. |
| 6,381,168 B2 | 4/2002 | Forbes |
| 6,399,979 B1 | 6/2002 | Noble et al. |
| 6,418,050 B2 | 7/2002 | Forbes |
| 6,429,065 B2 | 8/2002 | Forbes |
| 6,434,041 B2 | 8/2002 | Forbes et al. |
| 6,454,912 B1 | 9/2002 | Ahn et al. |
| 6,465,298 B2 | 10/2002 | Forbes et al. |
| 6,476,434 B1 | 11/2002 | Noble et al. |
| 6,486,027 B1 | 11/2002 | Noble et al. |
| 6,486,703 B2 | 11/2002 | Noble et al. |
| 6,492,233 B2 | 12/2002 | Forbes et al. |
| 6,495,436 B2 | 12/2002 | Ahn et al. |
| 6,498,065 B1 | 12/2002 | Forbes et al. |
| 6,514,828 B2 | 2/2003 | Ahn et al. |
| 6,515,510 B2 | 2/2003 | Noble et al. |
| 6,518,615 B1 | 2/2003 | Geusic et al. |
| 6,526,191 B1 | 2/2003 | Geusic et al. |
| 6,534,420 B2 | 3/2003 | Ahn et al. |
| 6,538,330 B1 | 3/2003 | Forbes |
| 6,586,792 B2 | 7/2003 | Ahn et al. |
| 6,597,037 B1 | 7/2003 | Forbes et al. |
| 6,608,378 B2 | 8/2003 | Forbes et al. |
| 6,661,058 B2 | 12/2003 | Ahn et al. |
| 6,689,660 B1 | 2/2004 | Noble et al. |
| 6,709,978 B2 | 3/2004 | Geusic et al. |
| 6,723,577 B1 | 4/2004 | Geusic et al. |
| 6,746,930 B2 | 6/2004 | Yang et al. |
| 6,754,108 B2 | 6/2004 | Forbes |
| 6,756,298 B2 | 6/2004 | Ahn et al. |
| 6,764,901 B2 | 7/2004 | Noble |
| 6,767,795 B2 | 7/2004 | Ahn et al. |
| 6,777,715 B1 | 8/2004 | Geusic et al. |
| 6,778,441 B2 | 8/2004 | Forbes et al. |
| 6,787,370 B2 | 9/2004 | Forbes |
| 6,787,413 B2 | 9/2004 | Ahn |
| 6,790,791 B2 | 9/2004 | Ahn et al. |
| 6,804,136 B2 | 10/2004 | Forbes |
| 6,812,100 B2 | 11/2004 | Ahn et al. |
| 6,812,513 B2 | 11/2004 | Geusic et al. |
| 6,812,516 B2 | 11/2004 | Noble, Jr. et al. |
| 6,818,937 B2 | 11/2004 | Noble et al. |
| 6,844,203 B2 | 1/2005 | Ahn et al. |
| 6,852,167 B2 | 2/2005 | Ahn |
| 6,858,120 B2 | 2/2005 | Ahn et al. |
| 6,858,444 B2 | 2/2005 | Ahn et al. |
| 6,878,624 B1 | 4/2005 | Bruley et al. |
| 6,884,739 B2 | 4/2005 | Ahn et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,953,730 B2 | 10/2005 | Ahn et al. |
| 6,958,302 B2 | 10/2005 | Ahn et al. |
| 6,960,538 B2 | 11/2005 | Ahn et al. |
| 7,323,423 B2 | 1/2008 | Brask et al. |
| 7,429,515 B2 | 9/2008 | Ahn et al. |
| 7,804,144 B2 | 9/2010 | Ahn et al. |
| 8,071,476 B2* | 12/2011 | Ahn et al. .............. 438/680 |
| 8,178,413 B2 | 5/2012 | Ahn et al. |
| 8,455,959 B2 | 6/2013 | Ahn et al. |
| 2002/0086521 A1 | 7/2002 | Ahn et al. |
| 2002/0086555 A1 | 7/2002 | Ahn et al. |
| 2002/0089063 A1 | 7/2002 | Ahn et al. |
| 2002/0122885 A1 | 9/2002 | Ahn |
| 2002/0130338 A1 | 9/2002 | Ahn et al. |
| 2002/0167089 A1 | 11/2002 | Ahn et al. |
| 2002/0192974 A1 | 12/2002 | Ahn et al. |
| 2002/0192975 A1 | 12/2002 | Ahn |
| 2003/0008243 A1 | 1/2003 | Ahn et al. |
| 2003/0020180 A1 | 1/2003 | Ahn et al. |
| 2003/0042527 A1 | 3/2003 | Forbes et al. |
| 2003/0043633 A1 | 3/2003 | Forbes et al. |
| 2003/0043637 A1 | 3/2003 | Forbes et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0136995 A1 | 7/2003 | Geusic et al. |
| 2003/0207032 A1 | 11/2003 | Ahn et al. |
| 2003/0207540 A1 | 11/2003 | Ahn et al. |
| 2003/0227033 A1 | 12/2003 | Ahn et al. |
| 2003/0228747 A1 | 12/2003 | Ahn et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0023461 A1 | 2/2004 | Ahn et al. |
| 2004/0036129 A1 | 2/2004 | Forbes et al. |
| 2004/0038554 A1 | 2/2004 | Ahn |
| 2004/0040494 A1 | 3/2004 | Vaartstra et al. |
| 2004/0041591 A1 | 3/2004 | Forbes |
| 2004/0043541 A1 | 3/2004 | Ahn et al. |
| 2004/0043569 A1 | 3/2004 | Ahn et al. |
| 2004/0094801 A1 | 5/2004 | Liang et al. |
| 2004/0110348 A1 | 6/2004 | Ahn et al. |
| 2004/0110391 A1 | 6/2004 | Ahn et al. |
| 2004/0140513 A1 | 7/2004 | Forbes et al. |
| 2004/0144980 A1 | 7/2004 | Ahn et al. |
| 2004/0156578 A1 | 8/2004 | Geusic et al. |
| 2004/0159863 A1 | 8/2004 | Eldridge et al. |
| 2004/0164357 A1 | 8/2004 | Ahn et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0214399 A1 | 10/2004 | Ahn et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023574 A1 | 2/2005 | Forbes et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0037563 A1 | 2/2005 | Ahn |
| 2005/0054165 A1 | 3/2005 | Ahn et al. |
| 2005/0070098 A1 | 3/2005 | Bruley |
| 2005/0077519 A1 | 4/2005 | Ahn et al. |
| 2005/0087134 A1 | 4/2005 | Ahn |
| 2005/0124175 A1 | 6/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0145959 A1 | 7/2005 | Forbes |
| 2005/0158973 A1 | 7/2005 | Ahn et al. |
| 2005/0164521 A1 | 7/2005 | Ahn et al. |
| 2005/0215015 A1 | 9/2005 | Ahn et al. |

(56) References Cited

U.S. PATENT DOCUMENTS

| | | | |
|---|---|---|---|
| 2005/0218462 A1 | 10/2005 | Ahn et al. |
| 2005/0227442 A1 | 10/2005 | Ahn et al. |
| 2012/0074487 A1 | 3/2012 | Ahn et al. |

OTHER PUBLICATIONS

Ahn, Kie Y, "ALD of Amorphous Lanthanide Doped TIOX Films", U.S. Appl. No. 11/092,072, filed Mar. 29, 2005, 04-1321.

Ahn, Kie Y, "Atomic Layer Deposited Hafnium Tantalum Oxide Dielectrics", U.S. Appl. No. 11/029,757, filed Jan. 5, 2005.

Ahn, Kie Y, "Atomic Layer Deposited Lanthanum Aluminum Oxide Dielectric Layer", U.S. Appl. No. 10/930,167, filed Aug. 31, 2004, 04-0686.

Ahn, Kie Y, "Atomic Layer Deposited Lanthanum Hafnium Oxide Dielectrics", U.S. Appl. No. 11/010,529, filed Dec. 13, 2004.

Ahn, Kie Y, "Atomic Layer Deposited Titanium Aluminum Oxide Films", U.S. Appl. No. 10/931,533, filed Aug. 31, 2004, client ref No. 04-0579.

Ahn, Kie Y, "Atomic Layer Deposited Titanium Silicon Oxide Films", U.S. Appl. No. 11/093,104, filed Mar. 29, 2005, 05-0019.

Ahn, Kie Y, "Atomic Layer Deposited Zirconium Silicon Oxide Films", U.S. Appl. No. 11/117,121, filed Apr. 28, 2005, 05-0061.

Ahn, Kie Y, "Atomic Layer Deposition of a Ruthenium Layer to a Lanthanide Oxide Dielectric Layer", U.S. Appl. No. 11/117,125, filed Apr. 28, 2005, 05-0116.

Ahn, Kie Y, "Atomic Layer Deposition of CEO2/Al2O3 Films As Gate Dielectrics", U.S. Appl. No. 11/055,380, filed Feb. 10, 2005, 04-1094.

Ahn, Kie Y, "Atomic Layer Deposition of DY-Doped HFO2 Films As Gate Dielectrics", U.S. Appl. No. 11/053,577, filed Feb. 8, 2005, 4-1179.

Ahn, Kie Y, "Atomic Layer Deposition of Hf3N4/HfO2 Films As Gate Dielectrics", U.S. Appl. No. 11/063,717, filed Feb. 23, 2005, 4-1248.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y, "Atomic Layer Deposition of Zr3N4/ZrO2 Films As Gate Dielectrics", U.S. Appl. No. 11/058,563, filed Feb. 15, 2005.

Ahn, Kie Y, "Atomic Layer Deposition of ZRX HFY SN1-X-Y O2 Films As High K Gate Dielectrics", U.S. Appl. No. 11/215,530, filed Aug. 29, 2005, 05-0311.

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films As Gate Dielectrics", U.S. Appl. No. 11/010,766, filed Dec. 13, 2004, 4-0997.

Ahn, Kie Y, "Iridium / Zirconium Oxide Structure", U.S. Appl. No. 11/152,759, filed Jun. 14, 2005, 5-0201.

Ahn, Kie Y, et al., "Magnesium Titanium Oxide Films", U.S. Appl. No. 11/189,075, filed Jul. 25, 2005, 5-0381.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004 (Client Ref. No. 04-0207).

Chao, Tien-Sheng, et al., "CoTiO3 High-K Dielectrics on HSG for DRAM Applications", IEEE Transactions on Electron Devices, vol. 51, No. 12, (Dec. 2004), 2200-2204.

Duenas, et al., "Interface Quality of High-Pressure Reactive Sputterd and Atomic Layer Deposited Titanium oxide Thin Films on Silicon", IEEE Transaction, Spanish Conference on Electronic Devices, (Feb. 2-4, 2005), 49-52.

Ichinose, Hiromichi, et al., "Deposition of LaMO3 (M = Co, Cr, Al) foms by spray pyrolysis in inductively coupled plasma", Journal of Crystal Growth 144, (1994), 59-64.

Leskela, M, "ALD precursor chemistry: Evolution and future challenges", Journal de Physique IV (Proceedings), 9(8), (Sep. 1999), 837-852.

Matsumoto, Yasumichi, et al., "A New Preparation Method of LaCoO3 Perovskite Using Electrochemical Oxidation", Inorg. Chem. 31, (1992), 738-741.

Matsumoto, Yuji, "Ferromagnetism in Co-Doped TiO 2 Rutile Thin Films Grown by Laser Molecular Beam", Japanese Journal of Applied Physics, 40, Part 2, No. 11B, http://jjap.ipap.jp/link?JJAP/40/L1204/, (Nov. 2001), L1204-L1206.

Pan, Tung Ming, et al., "High quality ultrathin CoTiO/sub 3/ high-k gate dielectrics", Electrochemical and Solid-State Letters, 3(9), (Sep. 2000), 433-434.

Pan, Tung Ming, et al., "High-k cobalt-titanium oxide dielectrics formed by oxidation of sputtered Co/Ti or Ti/Co films", Applied Physics Letters, 78(10), (Mar. 5, 2001), 1439-1441.

Puurunen, Riikka L, "Surface chemistry of atomic layer deposition: A case study for the trimethylaluminum/water process", J. Appl. Phys. 97, (2005), 121301 (52 pgs.).

Ritala, et al., "Atomic layer epitaxy—a valuable tool for nanotechnology?", Nanotechnology 10, (1999), 19-24.

Seim, Helene, et al., "Growth of LaCoO3 thin films from beta-dikentonate precursors", Applied Surface Science 112, (1997), 243-250.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Uchino, Kenji, et al., "Dependence of the Crystal Structure on Particle Size in Barium Titanate", J. Am. Ceram. Soc., vol. 72, No. 8, (1989), 1555-1558.

Wilk, G. D., "High-K gate dielectrics: Current status and materials properties considerations", Journal of Applied Physics, 89(10), (May 2001), 5243-5275.

\* cited by examiner

US 8,895,442 B2

COBALT TITANIUM OXIDE DIELECTRIC FILMS

PRIORITY APPLICATION

This application is a continuation of U.S. application Ser. No. 13/311,218, filed Dec. 5, 2011, now issued as U.S. Pat. No. 8,455,959, which is a is a divisional of U.S. application Ser. No. 11/216,958, filed Aug. 31, 2005, now issued as U.S. Pat. No. 8,071,476, both of which are incorporated herein by reference in their entirety.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs), which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
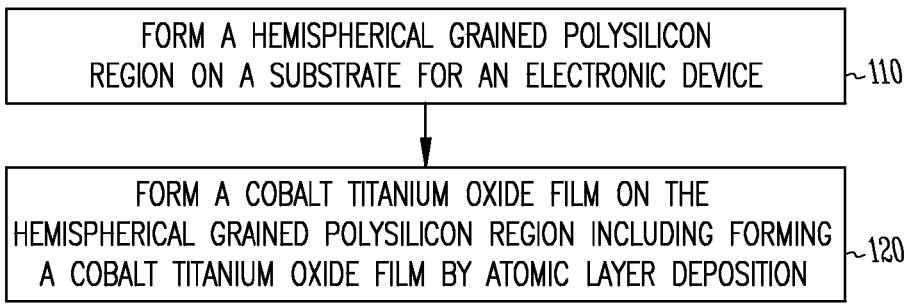
FIG. 1 illustrates a flow diagram of elements for an embodiment of a method to form a cobalt titanium oxide film.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined generally to include any material that is less electrically conductive than the materials referred to as conductors, as is known by those skilled in the art. The following detailed description is, therefore, not to be taken in a limiting sense, and the scope of the present invention is defined only by the appended claims, along with the full scope of equivalents to which such claims are entitled.

To scale a dielectric region to minimize feature sizes to provide high density electronic devices, the dielectric region should have a reduced equivalent oxide thickness ($t_{eq}$). The equivalent oxide thickness quantifies the electrical properties, such as capacitance, of the dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. This additional thickness may be eliminated by using a metal electrode, though such metal electrodes are not universally used for all devices. Thus, future devices would be designed towards a physical $SiO_2$ gate dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si electrode and an overlying polysilicon electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for Si based devices. This may require that the dielectric material employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a dielectric in a device are those that can be fabricated as a thin layer with an amorphous form and that have high dielectric constants.

An alternative approach to increasing capacitance by reducing the thickness of the material used as a capacitor dielectric includes increasing the area of the effective electrode of the capacitor structure. However, increasing the area of a planar electrode would increase the area on a die used for the capacitor structure, reducing the density of devices that may be provided on a die. Reducing device density is typically opposite to what is desired in designing integrated circuits. To increase electrode area while limiting the impact on device density, capacitive structures like trench capacitors have been used in which increased area may be provided in a direction essentially vertical to a typical horizontally planar capacitor structure. Another approach to increasing the effective area of a capacitor structure is to roughen the surface of one or more electrodes used in the capacitor structure. A roughened surface of an electrode provides increased surface area with respect to an un-roughened electrode, hence increased capacitance. One manner in which to provide a roughened surface includes using hemispherical grain (HSG) material as an electrode material, providing an increased surface area.

A hemispherical grain material may be viewed as having individual grains of the material protruding from the surface of the material. HSG polysilicon may be formed using a number of processes as is known to those skilled in the art. Further, HSG polysilicon may be constructed as one of several types of HSG. For example, HSG polysilicon may be formed as maximum-grain and high-density (MGHD) polysilicon. HSG polysilicon may be formed as small-grain and high-density (SGHD) polysilicon. HSG polysilicon may be formed as small-grain and low-density (SGLD) polysilicon.

In an embodiment, a capacitive structure having a HSG polysilicon on an electrode surface is provided with an enhanced capacitance relative to a capacitor structure having polysilicon as an electrode. In an embodiment, a dielectric layer containing a cobalt titanium oxide film may be disposed on the HSG polysilicon, providing increased capacitance in comparison to silicon oxide on HSG polysilicon. In various embodiments, the cobalt titanium oxide film may be structured as one or more monolayers. The cobalt titanium oxide film may be a specific stoichiometric cobalt titanium oxide. The cobalt titanium oxide film may be a non-stoichiometric cobalt titanium oxide. The cobalt titanium oxide film may be a combination of stoichiometric cobalt titanium oxide and non-stoichiometric cobalt titanium oxide.

An embodiment of a method for forming an electronic device may include forming cobalt titanium oxide by atomic layer deposition. Embodiments include structures and methods to form such structures for capacitors, transistors, memory devices, and electronic systems with dielectric layers containing cobalt titanium oxide structured as one or more monolayers.

The term cobalt titanium oxide is used herein with respect to a compound that contains cobalt, titanium, and oxide in a form that may be stoichiometric, non-stoichiometric, or a combination of stoichiometric and non-stoichiometric. Herein, cobalt titanium oxide may be expressed as $Co_xTi_yO_z$. The expression $Co_xTi_yO_z$ or its equivalent forms may be used to include a stoichiometric cobalt titanium oxide. The expression $Co_xTi_yO_z$ or its equivalent forms may be used to include a non-stoichiometric cobalt titanium oxide. The expression $Co_xTi_yO_z$ film or its equivalent forms may be used to include a combination of a stoichiometric cobalt titanium oxide and a non-stoichiometric cobalt titanium oxide. In an embodiment, a cobalt titanium oxide film includes $CoTiO_3$. The expression $CoO_x$ may be used to include a stoichiometric cobalt oxide. The expression $CoO_x$ may be used to include a non-stoichiometric cobalt oxide. The expression $CoO_x$ may be used to include a combination of a stoichiometric cobalt oxide and a non-stoichiometric cobalt oxide. The expression $TiO_y$ may be used to include a stoichiometric titanium oxide. The expression $TiO_y$ may be used to include a non-stoichiometric titanium oxide. The expression $TiO_y$ may be used to include a combination of a stoichiometric titanium oxide and a non-stoichiometric titanium oxide. In various embodiments, a cobalt titanium oxide film may be doped with elements or compounds other than cobalt, titanium, and oxygen.

In an embodiment, a film of cobalt titanium oxide, structured as one or more monolayers, may have a thickness that ranges from a monolayer to thousands of angstroms. The film may be processed by atomic layer deposition (ALD). A dielectric layer containing a cobalt titanium oxide film may be configured substantially as the cobalt titanium oxide film. Alternatively, a dielectric layer may include multiple layers with at least one layer being a film of cobalt titanium oxide. Dielectric layers of cobalt titanium oxide offer a material that can provide a relatively high dielectric constant with respect to that of silicon oxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current. Engineering a cobalt titanium oxide film may provide dielectric layers for electronic devices with dielectric constants that may range in value from about 15 for CoO or $Co_3O_4$ to about 80 for $TiO_2$. Engineering a cobalt titanium oxide film may provide dielectric layers for electronic devices with dielectric constants of 50 or larger. Lower dielectric constants may be associated with ultra-thin films due to size effects.

In an embodiment, a cobalt titanium oxide dielectric layer may be formed as a conformal layer on a HSG polysilicon surface using atomic layer deposition. Further, forming such a dielectric layer using atomic layer deposition may control transitions between material layers. Thus, atomic layer deposited cobalt titanium oxide dielectric layers can have an engineered transition with the HSG polysilicon surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming titanium oxide from a $TiI_4$ precursor and $H_2O_2$, as its reactant precursor, forms an embodiment of a titanium/oxygen sequence, which can also be referred to as a titnaium sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, $H_2O_2$ is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of cobalt titanium oxide is formed on a substrate mounted in a reaction chamber using ALD in repetitive cobalt and titanium sequences using precursor gases individually pulsed into the reaction chamber. Alternatively, solid or liquid precursors can be used in an appropriately designed reaction chamber.

In an embodiment, cobalt titanium oxide film may be formed by atomic layer deposition in a dielectric region of an electronic device. The $Co_xTi_yO_z$ film may be formed in various structures. One such structure may include a hemispherical polysilicon region configured as an electrode of a capacitor. FIG. 1 illustrates a flow diagram of elements for an embodiment of a method to form a dielectric layer containing a cobalt titanium oxide layer disposed on hemispherical grain polysilicon. Initially, a substrate on which such a structure is to be deposited may be prepared. The substrate may typically be a silicon or silicon containing material. In other embodiments, germanium, gallium arsenide, silicon-on-sapphire substrates, or other suitable substrates may be used. In an embodiment, a preparation process may include cleaning the substrate and forming layers and regions of the substrate, such as drains and sources of a metal oxide semiconductor (MOS) transistor, prior to forming HSG polysilicon. In an embodiment, the substrate is cleaned to provide an initial substrate depleted of its native oxide.

At 110, a hemispherical grained polysilicon region may be formed on a substrate for an electronic device. The HSG polysilicon may be formed by any number of processes that are known to those skilled in the art. In an embodiment, a maximum grain and high-density type hemispherical grained polysilicon may be formed on a substrate for an electronic device. In an embodiment, a small-grain and high-density type hemispherical grained polysilicon may be formed on a substrate for an electronic device. In an embodiment, a small-grain and high-density type hemispherical grained polysilicon may be formed on a substrate for an electronic device.

A $Co_xTi_yO_z$ layer may be formed by atomic layer deposition on various regions of an electronic device. At 120, a cobalt titanium oxide film may be formed on the HSG polysilicon region in the formation of a capacitor, where the cobalt titanium oxide film may be formed by atomic layer deposition. In an embodiment, the HSG polysilicon region may be cleaned to provide a hydrogen-terminated surface. In an embodiment, a HSG polysilicon region undergoes a final hydrofluoric (HF) rinse prior to ALD processing to provide the HSG polysilicon region with a hydrogen-terminated surface without a native silicon oxide layer. Cleaning immediately preceding atomic layer deposition aids in reducing an occurrence of silicon oxide as an interface between a HSG polysilicon region and a cobalt titanium oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its corresponding interface layer, a $SiO_2$ interface layer or other composition interface layer may improve the interface density, fixed charge density, and channel mobility of a device having this interface layer.

The sequencing of the formation of the regions of an electronic device being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

In an embodiment, a cobalt titanium oxide film may be formed by atomic layer deposition in various electronic devices using a number of precursors to provide cobalt. In an embodiment, a precursor containing cobalt includes Co(thd)$_2$ (thd=2,2,6,6-tetramethyl-3,5-heptanedione). Ozone may be used as its oxygen reactant precursor in a cobalt sequence. In an embodiment, the substrate temperature may be maintained at a temperature in the range from about 200° C. to about 400° C. Substrate temperatures are not limited to these temperatures, but may be maintained at a temperature suitable for its particular application.

In various embodiments, an oxygen reactant precursor for the ALD deposition of cobalt and oxygen may include, but is not limited to, one or more of water, atomic oxygen, molecular oxygen, ozone, hydrogen peroxide, a water-hydrogen peroxide mixture, alcohol, or nitrous oxide. In various embodiments, nitrogen may be used as a purging gas and a carrier gas for a cobalt sequence. Alternatively, argon gas or other inert gas may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In an embodiment, forming a cobalt titanium oxide film by atomic layer deposition may use a number of precursors to provide titanium for the cobalt titanium oxide film in a dielectric region in an electronic device. In an embodiment, a titanium halide may be used as a precursor in the ALD deposition process. In an embodiment, TiCl$_4$ may be used as a precursor in the ALD deposition process. In an embodiment using a TiCl$_4$ precursor, the substrate temperature may be maintained at a temperature ranging from about 100° C. to about 600° C. In an embodiment using a TiCl$_4$ precursor, the substrate temperature may be maintained at a temperature of about 425° C. In an embodiment, a titanium precursor pulsed in an ALD process may be a TiI$_4$ precursor. In an embodiment using a TiI$_4$ precursor, the substrate temperature may be maintained between about 230° C. and about 490° C. In an embodiment, a titanium precursor pulsed may be anhydrous Ti(NO$_3$)$_4$. In an embodiment using a Ti(NO$_3$)$_4$ precursor, the substrate temperature may be maintained at a temperature ranging from less than 250° C. to about 700° C. In an embodiment, a titanium precursor pulsed may be titanium isopropoxide, Ti(OCH(CH$_3$)$_2$)$_4$, also written as Ti(O$^i$—Pr)$_4$. In an embodiment using a Ti(O$^i$—Pr)$_4$ precursor, the substrate temperature may be maintained at a temperature ranging from less than 250° C. to about 700° C. In an embodiment, a titanium precursor may include Ti(OC$_2$H$_5$)$_4$. In an embodiment, a combination of a number of precursors containing titanium may be used for providing titanium to a surface. However, use of the individual titanium precursors is not limited to the temperature ranges of the above embodiments.

In various embodiments, an oxygen reactant precursor for the ALD deposition of titanium and oxygen may include, but is not limited to, one or more of water, atomic oxygen, molecular oxygen, ozone, hydrogen peroxide, a water-hydrogen peroxide mixture, alcohol, or nitrous oxide. In various embodiments, nitrogen may be used as a purging gas and a carrier gas for a titanium sequence. Alternatively, argon gas or other inert gas may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In an embodiment, in an ALD process for forming a cobalt titanium oxide film, the cobalt precursor may be pulsed to a surface before the titanium precursor is pulsed. In an embodiment, the titanium precursor may be pulsed before the cobalt precursor is pulsed. Alternatively, cobalt and titanium may be jointly provided to a substrate using precursors that substantially do not react with each other, but provide chemisorption or reaction at the substrate surface and allow subsequent reaction with an oxidant precursor. Alternatively, titanium precursors that contain oxygen may be used such that the titanium sequence does not use an oxygen reactant precursor. Cobalt precursors that contain oxygen may be used such that the cobalt sequence does not use an oxygen reactant precursor. Titanium precursors that contain oxygen, and cobalt precursors that contain oxygen, may be used such that the titanium sequence and the cobalt sequence do not use an oxygen reactant precursor. In various embodiments, an oxygen reactant precursor is pulsed after pulsing a purging gas following each pulsing of the titanium precursors and the cobalt precursors. In various embodiments, an oxygen reactant precursor is pulsed after evacuating the reaction chamber following each pulsing of the titanium precursors and the cobalt precursors.

After repeating the cobalt sequences and titanium sequences for a selected number of cycles, a determination may be made as to whether the number of cobalt titanium cycles equals a predetermined number to form the desired cobalt titanium oxide layer. If the total number of cycles to form the desired thickness has not been completed, a number of cycles for the cobalt titanium sequence is repeated. If the total number of cycles to form the desired thickness has been completed, the dielectric film containing the cobalt titanium oxide layer may optionally be annealed. The cobalt titanium oxide layer processed at these relatively low temperatures may provide an amorphous layer.

The thickness of a cobalt titanium oxide layer formed by atomic layer deposition may be determined by a fixed growth rate for the pulsing periods and precursors used, set at a value such as N nm/cycle, dependent upon the number of cycles of the cobalt titanium sequence. For a desired cobalt titanium oxide layer thickness, t, in an application, the ALD process is repeated for t/N total cycles. Once the t/N cycles have completed, no further ALD processing for the cobalt titanium oxide layer is required.

Embodiments for methods for forming cobalt titanium oxide film may include numerous permutations for forming the cobalt titanium oxide film. In an embodiment, the titanium sequence is conducted before the cobalt sequence. In an embodiment, a cobalt/titanium cycle may include a number, x, of cobalt sequences and a number, y, of titanium sequences. The number of sequences x, y may be selected to engineer the relative amounts of titanium to cobalt. In an embodiment, the number of sequences x and y, along with associated pulsing periods and times, is selected to form a cobalt titanium oxide with substantially equal amounts of cobalt and titanium. In an embodiment, the number of sequences is selected with x=y. In an embodiment, the number of sequences x and y are selected to form a cobalt-rich cobalt titanium oxide. Alternatively, the number of sequences x and y are selected to form a titanium-rich cobalt titanium oxide. In an embodiment of a method that includes forming a cobalt titanium oxide film, an atomic layer deposition sequence includes forming an atomic layer of cobalt oxide followed by forming an atomic layer of titanium oxide. In an embodiment of a method that includes forming a cobalt titanium oxide film, an atomic layer deposition sequence includes forming an atomic layer of titanium oxide followed by forming an atomic layer of cobalt oxide.

Atomic layer deposition of the individual components of the cobalt titanium oxide film allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a $Co_xTi_yO_z$ film, each precursor may be pulsed into the reaction under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

Films of $Co_xTi_yO_z$ may be processed over a wide range of temperatures. Low temperature processing may lead to an amorphous structure and have fewer adverse effects on the substrate and any devices formed prior to the ALD formation of the cobalt titanium film. In an embodiment, a film of $Co_xTi_yO_z$ is formed on a substrate with the substrate maintained at a temperature in the range from about 100° C. to about 600° C. The cobalt titanium oxide film may be formed as an integral component of an electronic device in an integrated circuit.

A cobalt titanium oxide film may be formed using a number of cycles having various permutations of cobalt/oxide sequences and titanium/oxide sequences. In an embodiment, the cobalt sequences and the titanium sequences are controlled to form the cobalt titanium oxide film with a predetermined amount of titanium with respect to the total amount of titanium and cobalt in the cobalt titanium oxide film. By controlling the content of the titanium and the cobalt in the cobalt titanium oxide film, a film may be engineered with predetermined electrical characteristics. With high titanium content relative to cobalt, the dielectric constant of the film approaches that of titanium oxide, about 80. With low titanium content relative to cobalt, the dielectric constant of the film approaches that of cobalt oxide, about 15. In an embodiment, a $Co_xTi_yO_z$ film has a cobalt to titanium ratio ranging from about 0.8 to about 1.2. In an embodiment, a $Co_xTi_yO_z$ film has a cobalt to titanium ratio of about 1.0. The titanium content may be adjusted to provide a cobalt titanium oxide film having a dielectric constant in the 25-80 range. The titanium content may be adjusted to provide a cobalt titanium oxide film having a dielectric constant of 50 or greater.

Either before or after forming the cobalt titanium film, other dielectric layers such as nitride layers, insulating metal oxide layers, or combinations of nitride and insulating metal oxide layers may be formed as part of a dielectric layer or dielectric stack. Depending on the application, a dielectric stack containing a cobalt titanium oxide film may include a silicon oxide layer. The dielectric layer may be formed as a nanolaminate. An embodiment of a nanolaminate may include a layer of cobalt oxide and a cobalt titanium oxide film, a layer of titanium oxide and a cobalt titanium oxide film, layers of cobalt oxide and titanium oxide along with a cobalt titanium oxide film, or various other combinations. Alternatively, the dielectric layer may be formed substantially as the cobalt titanium oxide film.

In various embodiments, the structure of an interface between a dielectric layer and a surface on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In the various embodiments, the thickness of a cobalt titanium oxide film is related to the number of ALD cycles performed and the growth rate associated with the selected permutations of sequences in the cycles. As can be understood by those skilled in the art, particular effective growth rates for the engineered cobalt titanium oxide film can be determined during normal initial testing of the ALD system for processing a cobalt titanium oxide dielectric for a given application without undue experimentation.

With the formation of a $Co_xTi_yO_z$ film, a conductive layer may be formed contacting the dielectric layer. The conductive layer may be formed by atomic layer deposition. In an embodiment, a titanium nitride layer may be formed as a conductive layer contacting the dielectric layer. The titanium nitride layer may be formed by ALD using precursors containing titanium used in the formation of the $Co_xTi_yO_z$ film. In an embodiment, a $LaCoO_x$ layer may be formed as a conductive layer contacting the dielectric layer. The $LaCoO_x$ layer may be a stoichiometric $LaCoO_x$ layer. The $LaCoO_x$ layer may be a non-stoichiometric $LaCoO_x$ layer. The $LaCoO_x$ layer may be a layer having a combination of stoichiometric $LaCoO_x$ and non-stoichiometric $LaCoO_x$. The $LaCoO_x$ layer may be formed by ALD using a $Co(thd)_2$ precursor to provide cobalt and any number of precursors to provide lanthanum. In an embodiment, a precursor containing lanthanum includes $La(thd)_3$. In an embodiment, a precursor containing lanthanum includes a trisethylcyclopentadionatolanthanum ($La(EtCp)_3$) precursor. In an embodiment, a precursor containing lanthanum includes a trisdipyvaloylmethanatolanthanum ($La(DPM)_3$) precursor. In an embodiment, a precursor containing lanthanum includes a $La(C_{11}H_{19}O_2)_3CH_3(OCH_2CH_2)_4OCH_3$ precursor. In an embodiment, a $LaCoO_x$ layer may be formed as a $LaCoO_3$ layer.

Figure 2:
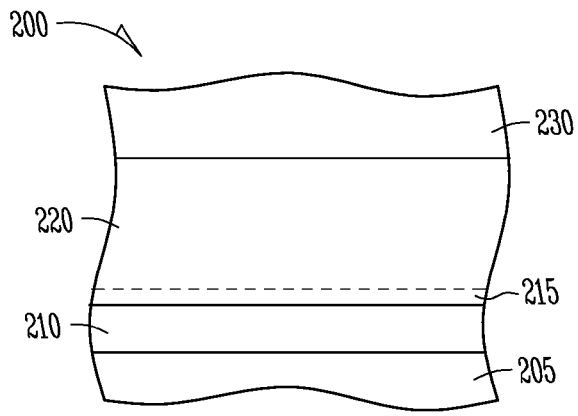
FIG. 2 shows an embodiment of a capacitor having a cobalt titanium oxide layer on a hemispherical grained polysilicon region.

Embodiments of methods for forming dielectric layers containing a cobalt titanium oxide film on a HSG polysilicon to provide increased capacitance may be applied to forming capacitors in various integrated circuits, memory devices, and electronic systems. In an embodiment for a capacitor 200 illustrated in FIG. 2, a method includes forming a first conductive layer 210 on a substrate 205, forming a dielectric layer 220 containing a cobalt titanium oxide film structured as one or more monolayers on the first conductive layer 210, and forming a second conductive layer 230 on dielectric layer 220. In an embodiment, first conductive layer 210 may be formed as a HSG polysilicon layer. HSG polysilicon 210 may be formed as MGHD polysilicon. HSG polysilicon 210 may be formed as SGHD polysilicon. HSG polysilicon 210 may be formed as SGLD polysilicon. The cobalt titanium oxide film of dielectric layer 220 may be formed by atomic layer deposition. Conductive layer 230 may include titanium nitride. The titanium nitride may be formed by atomic layer deposition. Conductive layer 230 may include a $LaCoO_x$ layer. The $LaCoO_x$ layer may be formed by atomic layer deposition. An interfacial layer (not shown) may form between first conductive layer 210 and dielectric layer 220. In an embodiment, such an interfacial layer may be limited to a relatively small thickness compared to dielectric layer 220, or to a thickness significantly less than dielectric layer 220 as to be effectively eliminated.

In an embodiment, a nitride layer 215 may optionally be formed between dielectric layer 220 and HSG polysilicon 210. Nitride layer 215 may be used to prevent oxidation of the HSG polysilicon during formation of dielectric layer 220. Nitride layer 215 may be formed as a dielectric nitride essentially as part of dielectric layer 220. Nitride layer 215 may be formed as a conductive nitride as part of first conductive layer 220. In an embodiment, nitride layer 215 includes titanium nitride. The titanium nitride may be formed by atomic layer deposition.

Dielectric layer 220 may be realized as a dielectric layer formed substantially of cobalt titanium oxide. Dielectric layer 220 may include multiple layers in which at least one layer is substantially cobalt titanium oxide. In an embodiment, dielectric layer 220 may include multiple layers where a substantially cobalt titanium oxide film contacts HSG polysilicon 210. Embodiments for dielectric layer 220 disposed on HSG polysilicon 210 in a capacitor include, but are not limited to, dielectrics in DRAM capacitors and dielectrics in capacitors in analog, radio frequency (RF), and mixed signal integrated circuits, where mixed signal integrated circuits operate with digital and analog signals. Alternatively, dielectric layer 220, where dielectric layer contains a cobalt titanium oxide film, may be disposed on conductive layer 210, in which conductive layer 210 provides a smooth surface for dielectric layer. Enhanced capacitance may be provided by a $Co_xTi_yO_z$ film relative to a capacitor structure using a silicon oxide dielectric without using a hemispherical grain polysilicon electrode. Embodiments for dielectric layer 220 containing a cobalt titanium oxide film in a capacitor, where the cobalt titanium oxide film is structured as one or more monolayers, include, but are not limited to, dielectrics in DRAM capacitors and dielectrics in capacitors in analog, radio frequency (RF), and mixed signal integrated circuits, where mixed signal integrated circuits operate with digital and analog signals.

In various embodiments, capacitive structures as integral parts of electronic devices may be formed with a dielectric layer containing a cobalt titanium oxide film. In various embodiments, capacitive structures as integral parts of electronic devices may be formed with a dielectric layer containing a cobalt titanium oxide film, where the dielectric layer is formed on a HSG polysilicon. The cobalt titanium oxide film may be structured as one or more monolayers. The cobalt titanium oxide film may be formed by atomic layer deposition.

Figure 3:
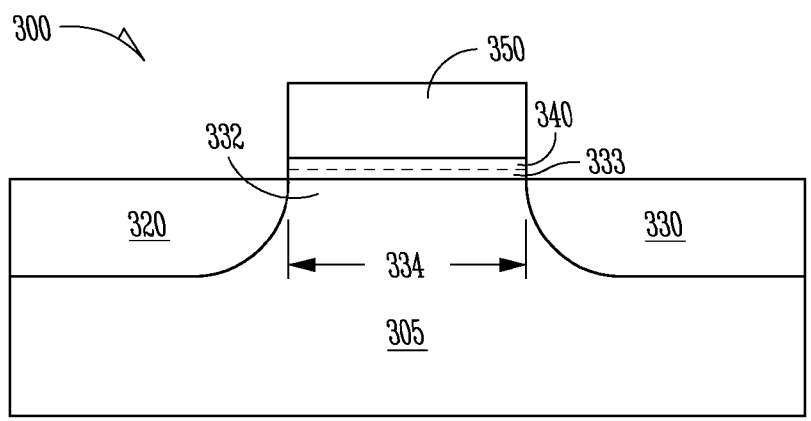
FIG. 3 shows an embodiment of a transistor having a dielectric layer containing a cobalt titanium oxide layer.

FIG. 3 illustrates a transistor 300 that may be constructed by forming a source region 320 and a drain region 330 in a silicon based substrate 305, where source and drain regions 320, 330 are separated by a body region 332. Body region 332 defines a channel having a channel length 334. A gate 350 is formed over and contacts gate dielectric 340 disposed on body region 332. Gate 350 may include titanium nitride. The titanium nitride may be formed by atomic layer deposition. Gate 350 may include a $LaCoO_x$ layer. The $LaCoO_x$ layer may be formed by atomic layer deposition.

In an embodiment, gate dielectric 340 contains a cobalt titanium oxide film. Gate dielectric 340 may be realized as a dielectric layer formed substantially of a cobalt titanium oxide film. Gate dielectric 340 may be a dielectric layer containing one or more layers of dielectric material in which at least one layer is a cobalt titanium oxide film. The cobalt titanium oxide film may be a cobalt titanium oxide film structured as monolayers of cobalt titanium oxide. The cobalt titanium oxide may be formed by atomic layer deposition. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

The sequencing of the various elements of the process for forming a transistor may be conducted with standard fabrication processes, as known to those skilled in the art. In an embodiment, gate dielectric 340 may be realized as a gate insulator in a silicon CMOS transistor. Use of such a gate dielectric, which includes a cobalt titanium oxide film, is not limited to silicon based substrates, but may be used with a variety of semiconductor substrates. The cobalt titanium oxide film may be an atomic layer deposited cobalt titanium oxide film.

Figure 4:
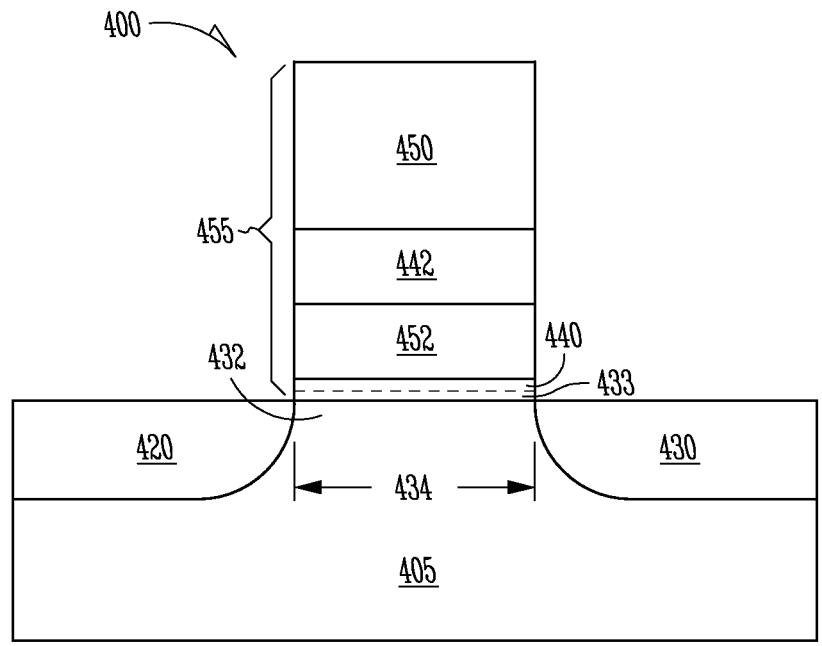
FIG. 4 shows an embodiment of a floating gate transistor having a dielectric layer containing a cobalt titanium oxide film.

FIG. 4 shows an embodiment of a configuration of a floating gate transistor 400 having an insulating layer containing a cobalt titanium oxide film. Transistor 400 may include a silicon based substrate 405 with a source 420 and a drain 430 separated by a body region 432. Body region 432 between source 420 and drain 430 defines a channel region having a channel length 434. Located above body region 432 is a stack 455 including a gate dielectric 440, a floating gate 452, a floating gate dielectric 442, and a control gate 450.

Control gate 450 may include titanium nitride. The titanium nitride may be formed by atomic layer deposition. Control gate 450 may include a $LaCoO_x$ layer. The $LaCoO_x$ layer may be formed by atomic layer deposition. In an embodiment, floating gate 452 is formed over and contacts gate dielectric 440. In an embodiment, floating gate 452 may include titanium nitride. The titanium nitride may be formed by atomic layer deposition. Floating gate 452 may include a $LaCoO_x$ layer. The $LaCoO_x$ layer may be formed by atomic layer deposition.

In an embodiment, gate dielectric 440 includes a dielectric containing a cobalt titanium oxide film structured as one or more monolayers. In an embodiment, gate dielectric 440 includes a dielectric containing an atomic layer deposited cobalt titanium oxide film. Gate dielectric 440 may be realized as a dielectric layer formed substantially of cobalt titanium oxide. Gate dielectric 440 may include multiple layers in which at least one layer is substantially cobalt titanium oxide. In an embodiment, gate dielectric 440 may include multiple layers where a substantially cobalt titanium oxide film contacts body region 432.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated.

In an embodiment, floating gate dielectric 442 includes a dielectric layer having a cobalt titanium oxide film structured as one or more monolayers. In an embodiment, floating gate dielectric 442 includes a dielectric containing an atomic layer deposited cobalt titanium oxide film. Floating gate dielectric 442 may be realized as a dielectric layer formed substantially of cobalt titanium oxide. Floating gate dielectric 442 may include multiple layers in which at least one layer is substantially cobalt titanium oxide. In an embodiment, control gate 450 is formed over and contacts floating gate dielectric 442.

Alternatively, both gate dielectric 440 and floating gate dielectric 442 may be formed as dielectric layers including a cobalt titanium oxide film. In an embodiment, gate dielectric 440 forms a tunnel gate insulator and floating gate dielectric 442 forms an inter-gate insulator in flash memory devices. Gate dielectric 440 may include an insulating layer having a cobalt titanium oxide structured as one or more monolayers. Floating gate dielectric 442 may include an insulating layer having a cobalt titanium oxide structured as one or more monolayers. Gate dielectric 440 and floating gate dielectric 442 may each include an insulating layer having a cobalt titanium oxide film structured as one or more monolayers. Use of dielectric layers configured in various embodiments is not limited to silicon based substrates, but may be used with a variety of semiconductor substrates. The cobalt titanium oxide may be an atomic layer deposited cobalt titanium oxide.

Various embodiments for a dielectric layer containing a cobalt titanium oxide film structured as one or more monolayers may provide for enhanced device performance by providing devices with reduced leakage current. The cobalt titanium oxide film may include atomic layer deposited $Co_xTi_yO_z$. In an embodiment, such improvements in leakage current characteristics may be attained by forming one or more layers of an atomic layer deposited cobalt titanium oxide in a multi-layer dielectric stack such as a nanolaminate structure. In an embodiment, a nanolaminate may include a cobalt titanium oxide layer with other dielectric layers including other metal oxides such as cobalt oxide. In an embodiment, a nanolaminate may include a cobalt titanium oxide layer with other dielectric layers including other metal oxides such as titanium oxide. In an embodiment, a nanolaminate may include a cobalt titanium oxide layer with other dielectric layers including other metal oxides such as a cobalt oxide and a titanium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range.

Further, each individual material layer of the nanolaminate can have a thickness as low as a monolayer of the material or as high as 20 nanometers. In an embodiment, a $CoO_x/Co_xTi_yO_z$ nanolaminate contains alternating layers of cobalt oxide and cobalt titanium oxide. In an embodiment, a $TiO_y/Co_xTi_yO_z$ nanolaminate contains alternating layers of titanium oxide and cobalt titanium oxide. In an embodiment, a $CoO_z/TiO_y/Co_xTi_yO_z$ nanolaminate contains various permutations of cobalt oxide layers, titanium oxide layers, and cobalt titanium oxide layers.

Figure 5:
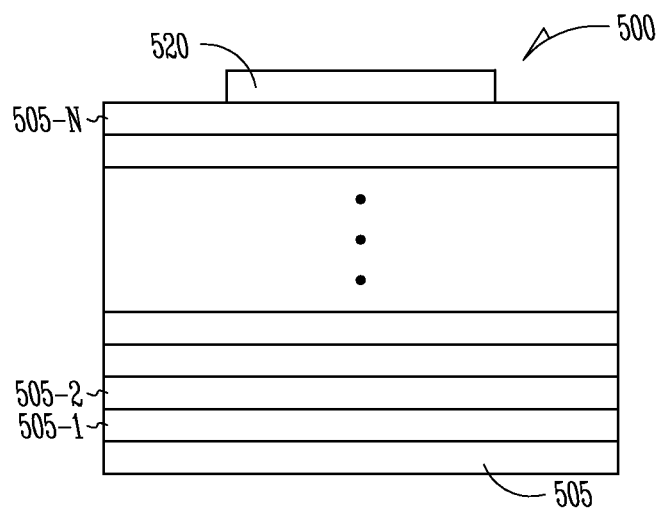
FIG. 5 depicts an embodiment of a dielectric layer including a nanolaminate having at least one cobalt titanium oxide layer.

FIG. 5 depicts a nanolaminate structure 500 for an embodiment of a dielectric structure including a cobalt titanium oxide film structured as one or more monolayers. The cobalt titanium oxide film may include atomic layer deposited $Co_xTi_yO_z$. In an embodiment, nanolaminate structure 500 includes a plurality of layers 505-1, 505-2 to 505-N with conductive contacts 505 and 520. In an embodiment, nanolaminate structure 500 includes a plurality of layers 505-1, 505-2 to 505-N, where at least one layer contains a cobalt titanium oxide film formed according to various embodiments. The other layers may be other dielectric layers such as, but not limited to, dielectric metal oxides, insulating nitrides, and insulating oxynitrides such as silicon oxynitirde. The sequencing of the layers depends on the application. In an embodiment, an atomic layer deposited cobalt titanium oxide film may be the first layer formed on a substrate.

In an embodiment, nanolaminate structure 500 contains an atomic layer deposited cobalt titanium oxide film in contact with conductive contact 505. In an embodiment, conductive contact 505 may include titanium nitride. The titanium nitride may be structured as one or more monolayers. The titanium nitride may be formed by atomic layer deposition. In an embodiment, conductive contact 505 may include a $LaCoO_x$ layer. The $LaCoO_x$ layer may be structured as one or more monolayers. The $LaCoO_x$ layer may be formed by atomic layer deposition.

In an embodiment, nanolaminate structure 500 contains an atomic layer deposited cobalt titanium oxide film in contact with conductive contact 520. In an embodiment, conductive contact 520 may include titanium nitride. The titanium nitride may be structured as one or more monolayers. The titanium nitride may be formed by atomic layer deposition. In an embodiment, conductive contact 520 may include a $LaCoO_x$ layer. The $LaCoO_x$ layer may be structured as one or more monolayers. The $LaCoO_x$ layer may be formed by atomic layer deposition. In an embodiment, nanolaminate structure 500 contains one or more atomic layer deposited cobalt titanium oxide films in contact with conductive contact 505 and conductive contact 520.

The effective dielectric constant associated with nanolaminate structure 500 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 500 may be used as nanolaminate dielectrics in NROM flash memory devices as well as other integrated circuits. In an embodiment, a layer of the nanolaminate structure 500 is used to store charge in the NROM device. The charge storage layer of a nanolaminate structure 500 in an NROM device may be a silicon oxide layer.

Transistors, capacitors, and other devices having dielectric films containing an atomic layer deposited cobalt titanium oxide film may be implemented into memory devices and electronic systems including information handling devices. Embodiments of these information handling devices may include wireless systems, telecommunication systems, and computers. Further, embodiments of electronic devices having dielectric films containing a cobalt titanium oxide film structured as one or more monolayers may be realized as integrated circuits. In various embodiments, a dielectric layer of a capacitor, which contains a cobalt titanium oxide film, may be formed on a hemispherical grain polysilicon. The HSG polysilicon may be formed as MGHD polysilicon. The HSG polysilicon may be formed as SGHD polysilicon. The HSG polysilicon may be formed as SGLD polysilicon.

Figure 6:
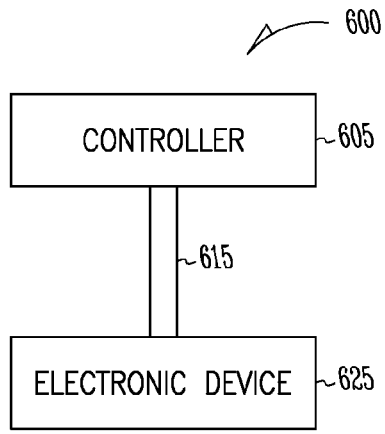
FIG. 6 is a simplified diagram for an embodiment of a controller coupled to an electronic device, in which a dielectric layer has a cobalt titanium oxide film.

FIG. 6 illustrates a diagram for an electronic system 600 having one or more devices having a dielectric layer containing a cobalt titanium oxide film structured as one or more monolayers. The cobalt titanium oxide film may be fabricated by atomic layer deposition according to various embodiments. In an embodiment, such a dielectric layer is formed substantially as a cobalt titanium oxide film. The dielectric layer may be formed on a hemispherical grain polysilicon. Electronic system 600 includes a controller 605, a bus 615, and an electronic device 625, where bus 615 provides conductivity between controller 605 and electronic device 625. In various embodiments, controller 605 may include an embodiment for a dielectric layer having a cobalt titanium oxide film structured as one or more monolayers. In various embodiments, electronic device 625 may include an embodiment for a dielectric layer having a cobalt titanium oxide film structured as one or more monolayers. In various embodiments, controller 605 and electronic device 625 may include an embodiment for a dielectric layer having a cobalt titanium oxide film structured as one or more monolayers. The dielectric layer may be disposed on a HSG polysilicon layer. Electronic system 600 may include, but is not limited to, fiber optic systems, electro-optic systems, and information handling systems such as wireless systems, telecommunication systems, and computers.

Figure 7:
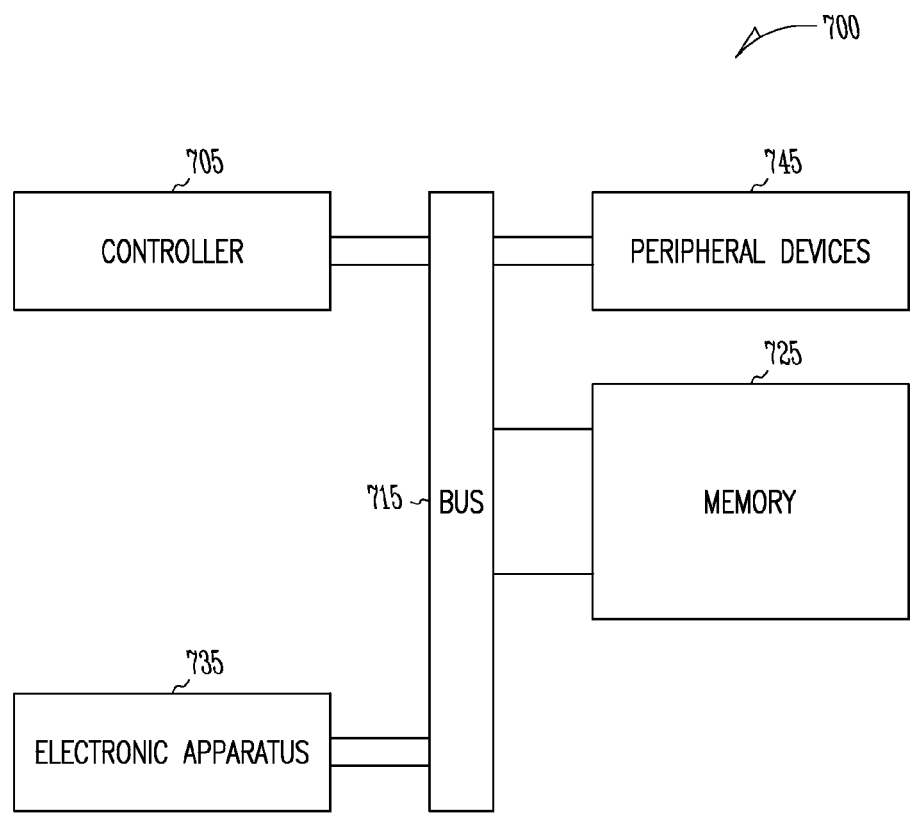
FIG. 7 illustrates a diagram for an embodiment of an electronic system having devices with a dielectric film containing a cobalt titanium oxide layer.

FIG. 7 depicts a diagram of an embodiment of a system 700 having a controller 705 and a memory 725. Controller 705 may include a dielectric layer having a cobalt titanium oxide film structured as one or more monolayers. Memory 725 may include a dielectric layer having a cobalt titanium oxide film structured as one or more monolayers. Controller 705 and memory 725 may include a dielectric layer having a cobalt titanium oxide film structured as one or more monolayers. The cobalt titanium oxide film may be fabricated by atomic layer deposition according to various embodiments. In an embodiment, such a dielectric layer is formed substantially as a cobalt titanium oxide film. The dielectric layer may be disposed on a HSG polysilicon layer. System 700 also includes an electronic apparatus 735 and a bus 715, where bus 715 provides conductivity between controller 705 and electronic apparatus 735, and between controller 705 and memory 725. Bus 715 may include an address, a data bus, and a control bus, each independently configured. Alternatively, bus 715 may use common conductive lines for providing address, data, control, or various combinations of address, data, and control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. Any of controller 705, memory 725, bus 715, electronic apparatus 735, and peripheral device or devices 745 may include a dielectric layer including a cobalt titanium oxide film structured as one or more monolayers. System 700 may include, but is not limited to, information handling devices such as wireless systems, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with memory 725.

Peripheral devices 745 may include displays, additional storage memory, or other control devices that may operate in conjunction with controller 705 and memory 725.

Memory 725 may be realized as a memory device containing a dielectric layer including a cobalt titanium oxide film structured as one or more monolayers. The dielectric layer may be configured in a memory cell of a memory array of memory 725. The cobalt titanium oxide film may be fabricated by atomic layer deposition according to various embodiments. In an embodiment, such a dielectric layer is formed substantially as a cobalt titanium oxide film. The dielectric layer may be disposed on a HSG polysilicon layer of a capacitor in a memory cell of a memory array of memory 725. It will be understood that embodiments are equally applicable to any size and type of memory circuit and are not intended to be limited to a particular type of memory device. Memory types may include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
   forming cobalt titanium oxide by a monolayer or partial monolayer sequencing process including:
   pulsing a cobalt-containing precursor;
   pulsing a titanium-containing precursor; and
   performing a removal process between pulsing the cobalt-containing precursor and pulsing the titanium-containing precursor such that a gas containing cobalt is not present when pulsing the titanium-containing precursor and a gas containing titanium is not present when pulsing the cobalt-containing precursor.

2. The method of claim 1, wherein forming the cobalt titanium oxide includes forming a dielectric stack including the cobalt titanium oxide.

3. The method of claim 2, wherein forming the dielectric stack includes forming an insulating nitride, an insulating metal oxide, or a combination of an insulating nitride and an insulating metal oxide.

4. The method of claim 2, wherein forming the dielectric stack includes forming silicon oxide.

5. The method of claim 4, wherein forming the silicon oxide includes arranging the silicon oxide in the dielectric stack such that the silicon oxide operatively provides a charge storage region.

6. The method of claim 2, wherein forming the dielectric stack includes forming the dielectric stack structured as a nanolaminate.

7. The method of claim 1, wherein the method includes doping the cobalt titanium oxide with an element or a compound other than cobalt, titanium, and oxygen.

8. The method of claim 1, wherein forming the cobalt titanium oxide includes forming the cobalt titanium oxide on a substrate with the substrate maintained at a temperature in the range from about 100° C. to about 600° C.

9. The method of claim 1, wherein forming the cobalt titanium oxide includes forming the cobalt titanium oxide with a high titanium content relative to cobalt.

10. The method of claim 1, wherein the method includes forming a conductive $LaCoO_x$ contacting the cobalt titanium oxide.

11. The method of claim 10, wherein forming the conductive $LaCoO_x$ includes forming the conductive $LaCoO_x$ by a monolayer or partial monolayer sequencing process.

12. A method comprising
   forming a hemispherical grained polysilicon region;
   forming cobalt titanium oxide above the hemispherical grained polysilicon region, the cobalt titanium oxide formed by a monolayer or partial monolayer sequencing process including:
   pulsing a cobalt-containing precursor;
   pulsing a titanium-containing precursor; and
   performing a removal process between pulsing the cobalt-containing precursor and pulsing the titanium-containing precursor such that a gas containing cobalt is not present when pulsing the titanium-containing precursor and a gas containing titanium is not present when pulsing the cobalt-containing precursor.

13. The method of claim 12, wherein forming the hemispherical grained polysilicon region includes forming a maximum grain and high-density type hemispherical grained polysilicon.

14. The method of claim 12, wherein forming the hemispherical grained polysilicon region includes forming a small-grain and high-density type hemispherical grained polysilicon.

15. The method of claim 12, wherein forming the hemispherical grained polysilicon region includes forming a small-grain and low-density type hemispherical grained polysilicon.

16. The method of claim 12, wherein the method includes forming a nitride between the hemispherical grained polysilicon region and the cobalt titanium oxide.

17. The method of claim 16, wherein forming the nitride includes forming a silicon nitride.

18. The method of claim 16, wherein forming the nitride includes forming a titanium nitride.

19. A method comprising:
    forming an array of memory cells such that forming each memory cell includes forming cobalt titanium oxide, the cobalt titanium oxide formed by a monolayer or partial monolayer sequencing process including:
        pulsing a cobalt-containing precursor;
        pulsing a titanium-containing precursor; and
        performing a removal process between pulsing the cobalt-containing precursor and pulsing the titanium-containing precursor such that a gas containing cobalt is not present when pulsing the titanium-containing precursor and a gas containing titanium is not present when pulsing the cobalt-containing precursor; and
    forming circuitry to access the memory array.

20. The method of claim 19, wherein the method includes forming the cobalt titanium oxide on a hemispherical grained polysilicon region.

21. The method of claim 20, wherein the method includes forming a conductive region on the cobalt titanium oxide.

22. The method of claim 21, wherein forming the conductive region includes forming a conductive nitride or a conductive metal oxide.

23. The method of claim 20, wherein the method includes forming silicon oxynitride between the hemispherical grained polysilicon region and the cobalt titanium oxide.

24. The method of claim 19, wherein forming the cobalt titanium oxide includes forming a dielectric stack including the cobalt titanium oxide.

25. The method of claim 24, wherein forming the dielectric stack includes forming silicon oxide, the silicon oxide arranged in the dielectric stack such that the silicon oxide operatively provides a charge storage region.

\* \* \* \* \*